(12) United States Patent
Choi et al.

(10) Patent No.: US 6,735,147 B2
(45) Date of Patent: May 11, 2004

(54) SEMICONDUCTOR MEMORY DEVICE AND A METHOD FOR GENERATING A BLOCK SELECTION SIGNAL OF THE SAME

(75) Inventors: Jung-Yong Choi, Gyeonggi-do (KR); Young-Gu Kang, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/318,446

(22) Filed: Dec. 13, 2002

(65) Prior Publication Data

US 2003/0128617 A1 Jul. 10, 2003

(30) Foreign Application Priority Data

Jan. 9, 2002 (KR) .................................. 10-2002-0001261

(51) Int. Cl.[7] .................................................. G11C 8/00
(52) U.S. Cl. ............................. 365/230.06; 365/230.03
(58) Field of Search ...................... 365/230.03, 230.06

(56) References Cited

U.S. PATENT DOCUMENTS 5,930,19 A * 7/1999 Yim ...................... 365/230.06

* cited by examiner

Primary Examiner—Son Mai
(74) Attorney, Agent, or Firm—Marger Johnson & McCollom, P.C.

(57) ABSTRACT

The present invention discloses a semiconductor memory device and a method of generating a block selection signal for the semiconductor memory device. The semiconductor memory device includes $2^n$ groups comprised of m memory cell array blocks and each of the memory cell array blocks has $(2^k+a)$ word lines. The semiconductor memory device further includes a first block selection signal generating circuit for generating first block selection signals for selecting one group of the $2^n$ groups by decoding a n-bit row address, a second block selection signal generating circuit for generating second block selection signals for selecting one memory cell array block in every group by decoding a l-bit row address, and a third block selection signal generating circuit for generating third block selection signals for selecting one memory cell array block out of $(m \times 2^n)$ memory cell array blocks by receiving the first block selection signals and the second block selection signals.

The semiconductor memory device having $(2^k+a)$ word lines in each memory cell array block occupies less area on a semiconductor substrate than a conventional semiconductor memory device having $2^k$ word lines.

20 Claims, 5 Drawing Sheets

SEMICONDUCTOR MEMORY DEVICE AND A METHOD FOR GENERATING A BLOCK SELECTION SIGNAL OF THE SAME

CROSS REFERENCE TO RELATED APPLICATIONS

This application claims priority to Korean Patent Application No. 2002-1261, filed on Jan. 9, 2002.

BACKGROUND OF THE INVENTION

1. Field of the Invention

The present invention relates to a semiconductor memory device having a plurality of memory cell array blocks, each of which has $2^K+a$ (k and a are an integer, respectively) word lines, and a method for generating a block selection signal for selecting said word lines.

2. Description of the Related Art

In general, a semiconductor memory device includes a plurality of memory cell array blocks and each of the memory cell array blocks has $2^k$ (k is an integer) word lines. Data is read out and written into a memory cell array block which is selected in response to a corresponding block selection signal.

FIG. 1 is a block diagram of a semiconductor memory device with a plurality of memory cell array blocks. FIG. 1 illustrates a conventional method of generating a block selection signal for selecting one memory cell array block from a plurality of memory cell array blocks. As shown in FIG. 1, the semiconductor memory device includes 16 memory cell array blocks BLK1–BLK16 and each of the blocks has 512 ($2^k$, k is 9) word lines WL1–WL512.

In FIG. 1, row address signals RA12B, RA11B, RA10B, and RA9B represent inverted signals of address signals RA12, RA11, RA10, and RA9, respectively. Block selection signals for selecting one of the memory cell array blocks BLK1–BLK16 are generated by decoding 4-bit row address signals RA12–RA9. Word line selection signals for selecting a word line out of 512 word lines in a memory cell array block are generated by decoding 9-bit row address signals RA0–RA8.

A conventional method for generating the block selection signals for selecting each of the 16 memory cell array blocks BLK1–BLK16 will be described below.

A block selection signal for selecting the first block BLK1 is generated when the row address signals RA12B, RA11B, RA10B and RA9B are all at a logic "high" level. A block selection signal for selecting the second block BLK2 is generated when the row address signals RA12B, RA11B, RA10B and RA9 are all at a logic "high" level. A block selection signal for selecting the third block BLK3 is generated when the row address signals RA12B, RA11B, RA10 and RA9B are all at a logic "high" level. A block selection signal for selecting the fourth block BLK4 is generated when the row address signals RA12B, RA11B, RA10 and RA9 are all in a logic "high" level. Similarly, a block selection signal for selecting the sixteenth block BLK16 is generated when the row address signals RA12, RA11, RA10 and RA9 have a logic "high" level.

FIG. 2 is a schematic block diagram showing the memory cell array block from FIG. 1 in more detail. Each of the memory cell array blocks BLK1–BLK16 includes a plurality of pairs of bit lines BL1–BL1B, BL2–BL2B, BL3–BL3B, etc.

Between each of the memory cell array blocks BLK1–BLK16, a pre-charge circuit 14-1 is arranged at the right end of bit line pairs BL1–BL1B, BL2–BL2B and a pre-charge circuit 14-2 is arranged at the left end of bit line pairs BL1–BL1B, BL2–BL2B.

Bit line isolation circuits 12-1 are arranged on the left side of a corresponding pre-charge circuit 14-1 and bit line isolation circuits 12-2 are arranged on the right side of a corresponding pre-charge circuit 14-2. Bit line isolation circuits 12-1 are comprised of two NMOS transistors N1 and N2. Bit line isolation circuits 12-2 are comprised of two NMOS transistors N3 and N4.

Sense amplifiers 10-1, 10-12 are connected to each of the corresponding bit line pairs by being interposed between the corresponding pre-charge circuit 14-1 or 14-2 and the bit line isolation circuit 12-1 or 12-2. The sense amplifier 10-1 is arranged on the left side of the first memory cell array block BLK1 and is coupled to the the bit line isolation circuit 12-1 by the bit line pair belonging to the first memory cell array block BLK1. The sense amplifier 10-12 is arranged on the right side of the sixteenth memory cell array block BLK16 and is coupled to the the bit line isolation circuit 12-2 by the bit line pair belonging to the sixteenth memory cell array block BLK16.

The sense amplifier 10-12 is arranged in a space between adjacent memory cell array blocks BLK1–BLK16 by being interposed between the corresponding bit line isolation circuits 12-1, 12-2. The sense amplifier 10-12 is shared by two memory cell array blocks which are arranged on the left side thereof and on the right side thereof, respectively. Each of the sense amplifiers 10-12 is coupled to each pair of the bit lines BL1–BL1B, BL2–BL2B, . . . , in two memory cell array blocks arranged on either side of the sense amplifier 10-12.

As shown in FIG. 1 and FIG. 2, the semiconductor memory device in accordance with the conventional art has $2^k$ memory cell arrays.

In FIG. 2, signals ISO1–ISO16 are the block selection signals for selecting one of the memory cell array blocks BLK1–BLK16.

Operation of the memory cell array shown in FIG. 2 is as follows:

During pre-charging operation, the pre-charge circuits 14-1, 14-2 pre-charge the pairs of bit lines BL1–BL1B, BL2–BL2B, etc.

After a word line WL1 is selected, charge sharing occurs between the pairs of bit lines BL1–BL1B, BL2–BL2B, etc, that are connected to the memory cells that are in turn coupled to the selected word line WL1 and the capacitors belonging to the corresponding memory cells.

After that, the signal ISO1 is generated with a "high" logic level when a block selection signal for selecting the memory cell block BLK1 is generated. As a result, the NMOS transistors N1–N4 of the bit line isolation circuits 12-1, 12-2 are turned on and the sense amplifiers 10-1, 10-12 are operated to amplify data signals from the pairs of bit lines.

As shown in FIG. 1 and FIG. 2, seventeen amplifying circuits for amplifying data signals produced by the pairs of bit lines are needed for the semiconductor memory device having 16 memory cell array blocks BLK1–BLK16. For example, fifteen of the seventeen amplifying circuits are arranged in every corresponding space between adjacent memory cell array blocks BLK1–BLK16 and two amplifying circuits are arranged beside the outermost memory cell array blocks BLK1, BLK16.

That is, a conventional semiconductor memory device requires seventeen data amplifying circuits, to such an extent that the memory cell array parts dominates a large area of the semiconductor substrate. Accordingly, it is difficult to reduce the chip size including the semiconductor memory device therein.

SUMMARY OF THE INVENTION

It is an object of the present invention to provide a semiconductor memory device having a reduced lay-out area dominated by the memory cell array.

It is another object of the present invention to provide a method of generating a block selection signal for a semiconductor memory device having $2^k$+a word lines in each memory cell array block.

In accordance with one aspect of the present invention, there is provided a semiconductor memory device including a memory cell array having $2^n$ (n is an integer) groups of memory cell array blocks, each of the group having m (m is an integer) memory cell array blocks, each of the memory cell array blocks having $2^K$+a (K and a are integers) word lines, and a block selection signal generating circuit for generating a block selection signal for selecting one of the memory cell array blocks by decoding a plurality of row address signals.

The block selection signal generating circuit comprises a first-step-block-selection signal generating circuit for generating a first-step-block-selection signal for selecting one group out of the $2^n$ groups, a second-step-block-selection signal generating circuit for generating a second-step-block-selection signal for selecting one memory cell array block in the every group, a third-step-block-selection signal generating circuit for generating a third-step-block-selection signal for selecting a memory cell array block out of the (m×$2^n$) memory cell array blocks in response to the first-step-block-selection signal and the second-step-block-selection signal.

In accordance with another aspect of the present invention, a method for generating a block selection signal is provided for a semiconductor memory device having a memory cell array including $2^n$ (n is an integer) groups comprised of m (m is an integer) memory cell array blocks, each of the memory cell array blocks having $2^k$+a (k, a are integers) word lines, comprising generating a block selection signal for selecting a memory cell array block out of (m×$2^n$) memory cell array blocks by decoding row address.

Generating a block selection signal comprises: generating first block selection signals for selecting each group of $2^n$ groups, generating second block selection signals for selecting in every group, and generating third block selection signals for each memory cell array block each memory cell array block out of the (m×$2^n$) memory cell array blocks by receiving the first block selection signals and the second block selection signals.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF THE INVENTION

Detailed reference will now be made to preferred embodiments of the present invention, examples of which is illustrated in the accompanying drawings.

Figure 3:
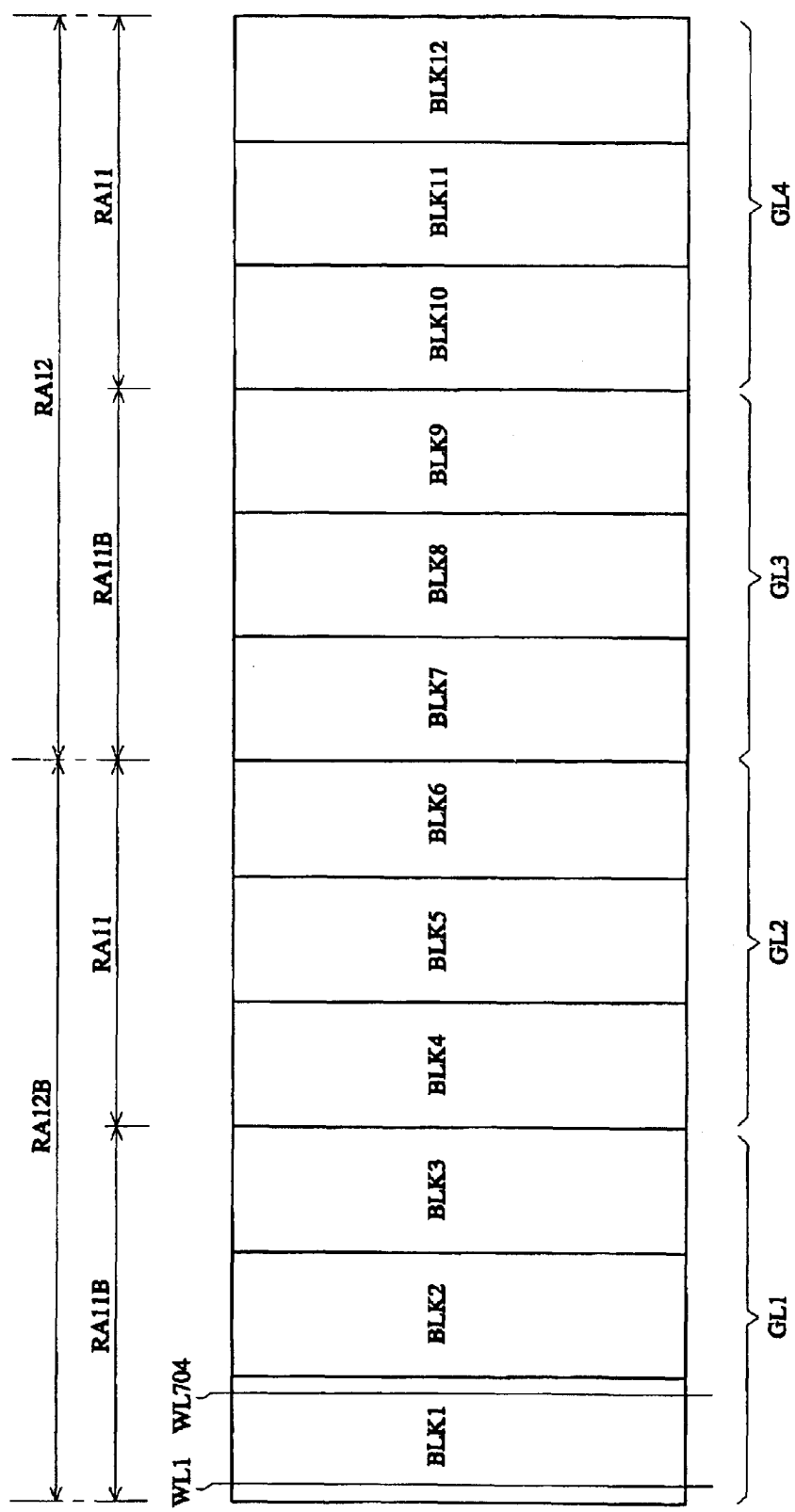
FIG. 3 is a block diagram of a semiconductor memory device in accordance with an embodiment of the invention that explains a method of generating a first block selection signal for selecting a plurality of memory cell array blocks.

FIG. 3 is a block diagram of a semiconductor memory device in accordance with an embodiment of the invention and explains a method for generating a block selection signal.

As shown in FIG. 3, the semiconductor memory device comprises twelve memory cell array blocks BLK1–BLK12 and each block has 704 ($2^K$+a, k=9, a=192) word lines. Each of the groups GL1–GL4 is comprised of three memory cell array blocks. Therefore, the semiconductor memory device in FIG. 3 has m×$2^n$ (m=3, n=2) memory cell array blocks.

Row address signals RA12B and RA11B are inverted signals of row address signals RA12 and RA11, respectively.

A first block selection signal selects a group of memory cell array blocks out of four groups of memory cell array blocks and each of the groups GL1, GL2, GL3, and GL4 is comprised of three memory cell array blocks BLK1–BLK3, BLK4–BLK6, BLK7–BLK9 and BLK10–BLK12, respectively.

A first block selection signal for selecting the first group GL1 comprised of three memory cell array blocks BLK1–BLK3 is generated when the row address signals RA12B and RA11B are in a logic "high" level. A first block selection signal for selecting a second group GL2 comprised of memory cell array blocks BLK4–BLK6 is generated when the row address signals RA12B and RA11 are in a logic "high" level. A first block selection signal for selecting a third group GL3 comprised of memory cell array blocks BLK7–BLK9 is generated when the row address signals RA12 and RA11B are in a logic "high" level. A first block selection signal for selecting a fourth group GL4 comprised of memory cell array blocks BLK10–BLK12 is generated when the row address signals RA12 and RA11 are in a logic "high" level.

Figure 1:
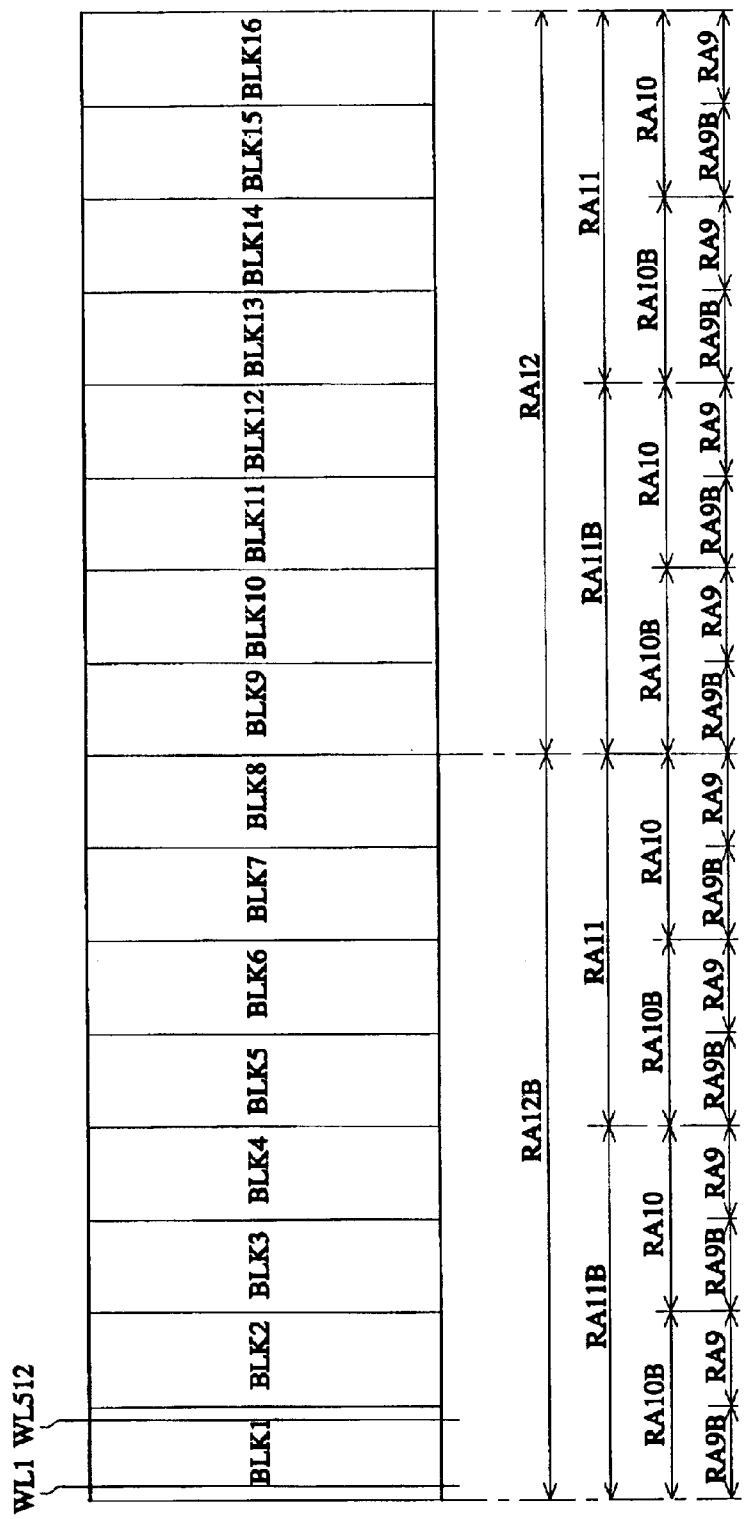
FIG. 1 is a block diagram of a conventional semiconductor memory device having a plurality of memory cell array blocks.
Figure 2:
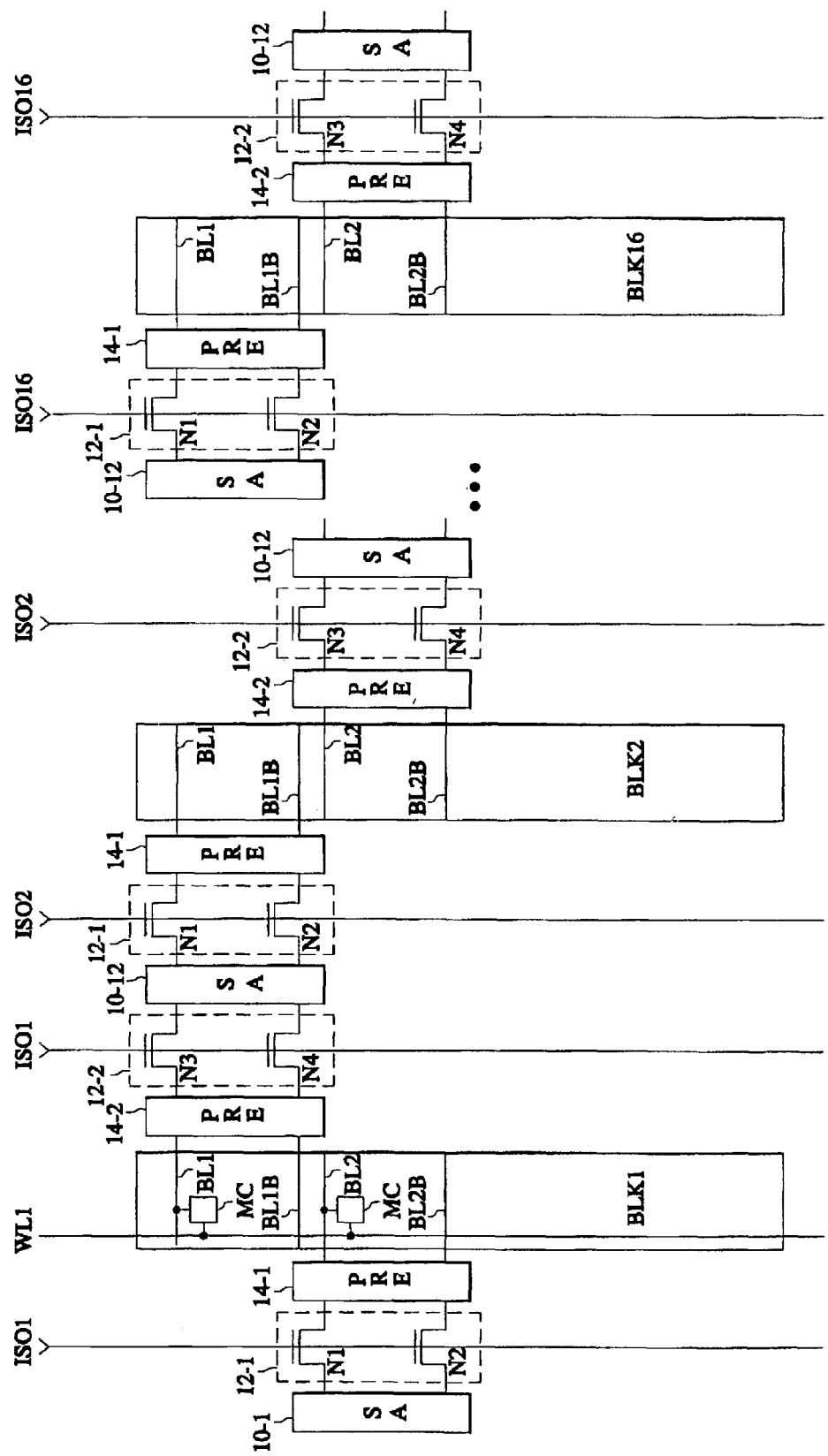
FIG. 2 is a schematic block diagram showing the conventional memory cell array blocks of FIG. 1 in more detail.

As shown in FIG. 3, the semiconductor memory device in accordance with an embodiment of the invention has 12 memory cell array blocks as opposed to 16 memory cell array blocks of the conventional semiconductor memory device shown in FIGS. 1 and 2. Therefore, the data amplifying circuits required by the embodiment are reduced from seventeen to thirteen. Accordingly, the layout area dominated by the memory cell array can be greatly reduced.

Figure 4:
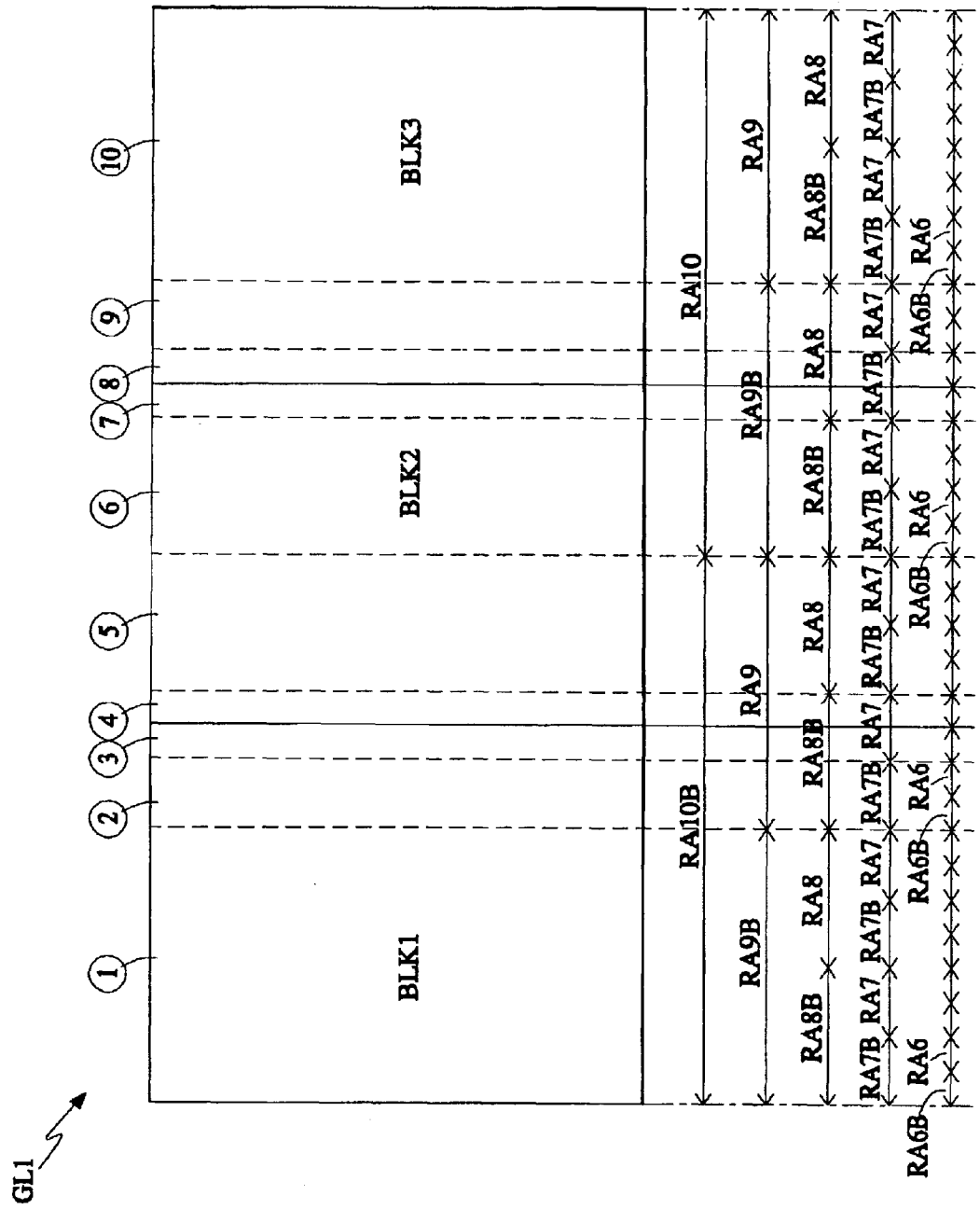
FIG. 4 is a block diagram of a semiconductor memory device in accordance with an embodiment of the invention that explains a method of generating a second block selection signal for selecting a memory cell array block out of three memory cell array blocks.

FIG. 4 is a schematic block diagram of the group GL1 shown in FIG. 3 explaining a method for generating a second block selection signal for selecting a memory cell array block from the group GL1 comprised of the three memory cell array blocks BLK1–BLK3.

In FIG. 4, row address signals RA10B, RA9B, RA8B, RA7B, and RA6B are inverted signals of RA10, RA9, RA8, RA7, and RA6, respectively.

The second block selection signals for selecting one of three memory cell array blocks BL1, BL2 and BL3 belonging to the first group GL1 is generated by decoding the row address signals RA10, RA9, RA8, RA7 and RA6.

In the same way that the first group GL1 is selected, a second block selection signal for selecting one of three memory cell array blocks belonging to the second group GL2 or the third group GL3 is also generated by decoding the row address signals RA10, RA9, RA8, RA7 and RA6.

A second block selection signal for selecting the memory cell array block BLK1 belonging to the first group GL1 is generated when the row address signals RA10B and RA9B are all in a logic "high" level, the row address signals RA10B, RA9, RA8B and RA7B are all in a logic "high" level, or the row address signals RA10B, RA9, RA8B, RA7B and RA6B are all in a logic "high" level. Therefore, word lines in a first area ① of the memory cell array block BLK1 are selected when the row address signals RA10B and RA9B are all in a logic "high" level. Word lines in a second area ② of the memory cell array block BLK1 are selected when the row address signals RA10B, RA9, RA8B and RA7B are all in a logic "high" level. Word lines in a third area ③ of the memory cell array block BLK1 are selected when the row address signals RA10B, RA9, RA8B, RA7B and RA6B are all in a logic "high" level.

A second block selection signal for selecting the memory cell array block BLK2 is generated when the row address signals RA10B, RA9, RA8B, RA7 and RA6 are all in a logic "high" level, the row address signals RA10B, RA9 and RA8B are all in a logic "high" level, the row address signals RA10, RA9B and RA8B are in a logic "high" level, or the row address signals RA10, RA9B, RA8, RA7B and RA6B are all in a logic "high" level.

Therefore, word lines in a fourth area ④ of the memory cell array block BLK2 are selected when the row address signals RA10B, RA9, RA8B, RA7 and RA6 are all in a logic "high" level. Word lines in a fifth area ⑤ of the memory cell array block BLK2 are selected when the row address signals RA10B, RA9 and RA8 are all in a logic "high" level. Word lines in a sixth area ⑥ of the memory cell array block BLK2 are selected when the row address signals RA10, RA9B and RA8B are all in a logic "high" level. Word lines in a seventh area ⑦ of the memory cell array block BLK2 are selected when the row address signals RA10, RA9B, RA8, RA7B and RA6B are all in a logic "high" level.

A second block selection signal for selecting the memory cell array block BLK3 is generated when the row address signals RA10, RA9B, RA8, RA7B and RA6 are all in a logic "high" level, the row address signals RA10, RA9B, RA8 and RA7 are all in a logic "high" level, or the row address signals RA10 and RA9 are all in a logic "high" level.

Therefore, word lines in an eighth area ⑧ of the memory cell array block BLK3 are selected when the row address signals RA10, RA9B, RA8, RA7B and RA6 are all in a logic "high" level, word lines in a ninth area ⑨ of the memory cell array block BLK3 are selected when the row address signals RA10, RA9B, RA8 and RA7 are all in a logic "high" level and word lines in a tenth area ⑩ of the memory cell array block BLK3 are selected when the row address signals RA10 and RA9 are all in a logic "high" level.

Even though not shown in FIG. 4, second block selection signals for selecting one of the three memory cell array blocks BLK4–BLK6, BLK7–BLK9 or BLK10–BLK12 are generated in the same way as the memory cell array blocks BLK1–BLK3.

Figure 5:
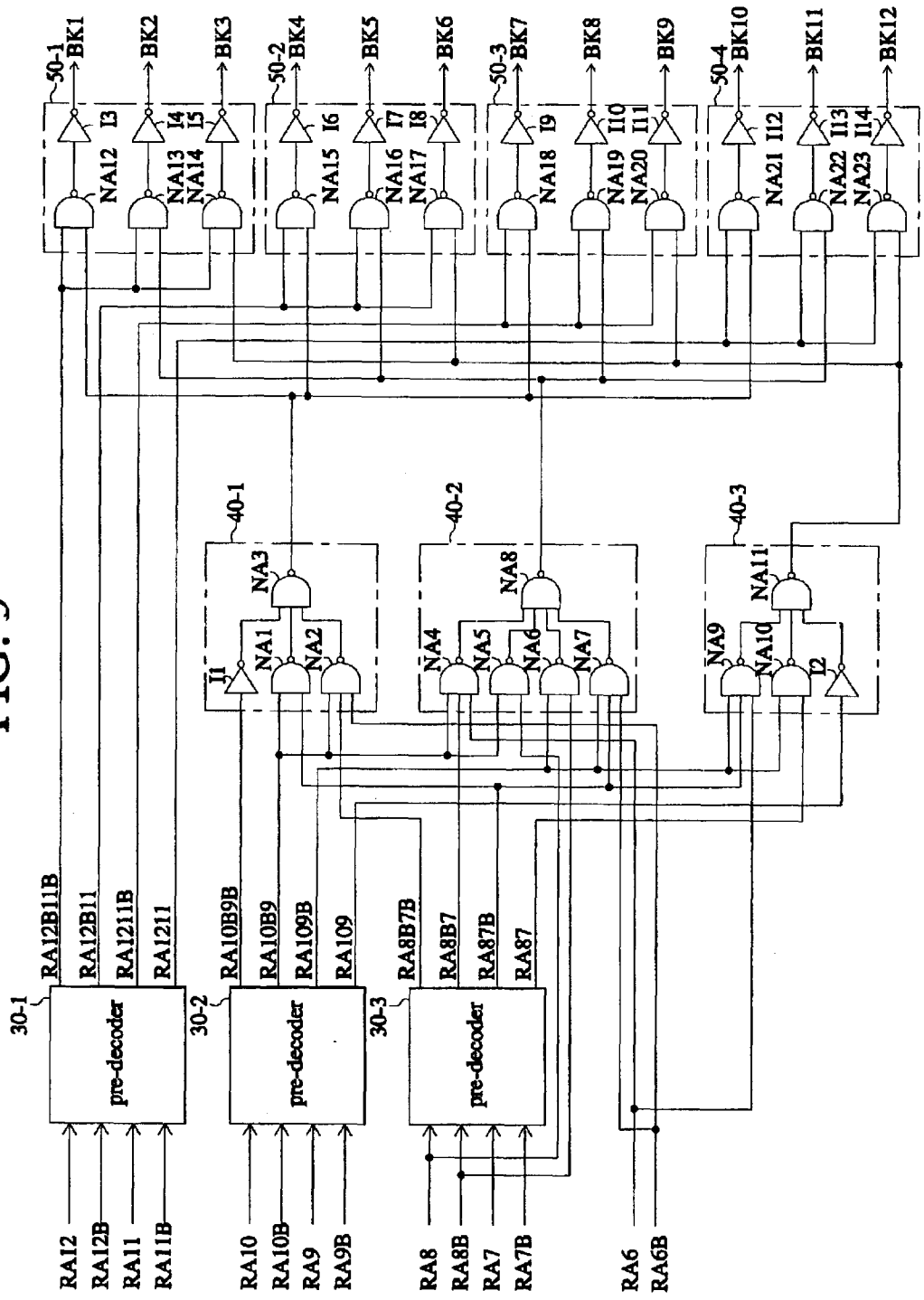
FIG. 5 is a block diagram of a semiconductor memory device in accordance with an embodiment of the invention that explains a method of generating a third block selection signal.

FIG. 5 is an exemplary circuit diagram for generating a third block selection signal for selecting one of the memory cell array blocks BLK1–BLK12 in accordance with an embodiment of the invention.

As shown in FIG. 5, the circuit for generating third block selection signals comprises pre-decoders 30-1, 30-2 and 30-3, second block selection signal generating circuits 40-1, 40-2 and 40-3, and third block selection signal generating circuits 50-1, 50-2, 50-3 and 50-4.

As shown in FIG. 5, the first of the second block selection signal generating circuits 40-1 comprises an inverter I1 and NAND gates NA1–NA3, the second of the second block selection signal generating circuit 40-2 comprises NAND gates NA4–NA8 and the third of the second block selection signal generating circuit 40-3 comprises an inverter I2 and NAND gates NA9–NA11.

Furthermore, the first of the third block selection signal generating circuits 50-1 comprises NAND gates NA12, NA13, NA14 and inverter I3, I4, I5. The second of the third block selection signal generating circuits 50-2 comprises NAND gates NA15, NA16, NA17 and inverters I6, I7, I8. The third of the third block selection signal generating circuits 50-3 comprises NAND gates NA18, NA19, NA20 and inverters I9, I10, I11. The fourth of the third block selection signal generating circuits 50-4 comprises NAND gates NA21, NA22, NA23 and inverters I12, I13, I14.

Operation of the circuit shown in FIG. 5 is discussed below.

The pre-decoder 30-1 decodes the row address signals RA12, RA12B, RA11, RA11B and generates four pre-decoded signals RA12B11B, RA12B11, RA1211B RA1211. The pre-decoding signals RA12B11B, RA12B11, RA1211B, RA1211 are first block selection signals for selecting one group from the four groups GL1–GL4 shown in FIG. 3.

The pre-decoder 30-2 decodes the row address signals RA10, RA10B, RA9, RA9B and generates pre-decoded signals RA10B9B, RA10B9, RA109B, RA109. The pre-decoder 30-3 decodes the row address signals RA8, RA8B, RA7, RA7B and generates four pre-decoded signals RA8B7B, RA8B7, RA87B, RA87.

The inverter I1 inverts the pre-decoded signal RA10B9B having a logic "high" level and generates a signal having a logic "low" level. The NAND gate NA1 generates a signal having a logic "low" level when the pre-decoded signals RA10B9 and RA8B7B are all in a logic "high" level. The NAND gate NA2 generates a signal having a logic "low" level when the pre-decoded signals RA10B9, RA8B7B and RA6B are all in a logic "high" level. The NAND gate NA3 generates a signal having a logic "low" level when output signals of the inverter I1 and the NAND gates NA1 and NA2 are all in a logic "high" level.

An output signal of the first of the second block selection signal generating circuits 40-1 is used for selecting the memory cell array blocks BLK1, BLK4, BLK7, BLK10 shown in FIG. 3

The NAND gate NA4 generates a signal having a logic "low" level when the pre-decoded signals RA10B9, RA8B7 and RA6 are all in a logic "high" level. The NAND gate NA5 generates a signal having a logic "low" level when the pre-decoded signals RA10B9 and RA8 are all in a logic "high" level. The NAND gate NA6 generates a signal having a logic "low" level when the pre-decoded signals RA109B and RA8B are all in a logic "high" level. The NAND gate NA7 generates a signal having a logic "low" level when the pre-decoded signals RA109B, RA87B and RA6B are all in a logic "high" level. The NAND gate NA8 generates a signal having a logic "low" level when the pre-decoded signals RA109B, RA87B and RA6B are all in a logic "high" level.

An output signal of the second of the second block selection signal generating circuits 40-2 is used for selecting the memory cell array blocks BLK2, BLK5, BLK8 and BLK11.

The NAND gate NA9 generates a signal having a logic "low" level when the pre-decoded signals RA109B, RA87B and RA6 are all in a logic "high" level. The NAND gate NA10 generates a signal having a logic "low" level when the pre-decoded signals RA109B and RA87 are all in a logic "high" level. The inverter I2 generates a signal having a logic "low" level when the pre-decoded signal RA109 is in a logic "high" level. The NAND gate NA11 generates a signal having a logic "high" level when output signals of the inverter I2 and the NAND gates NA9 AND NA10 are all in a logic "low" level.

An output signal of the third one of the second block selection signal generating circuits 40-3 is used for selecting the memory cell array blocks BLK3, BLK6, BLK9, BLK12.

The NAND gate NA12 and the inverter I3 logically multiply the pre-decoded signal RA12B11B having a logic level "high" and an output signal of the NAND gate NA3 and generate a first one of the third block selection signals BK1 for selecting the memory cell array block BLK1.

The NAND gate NA13 and the inverter I4 logically multiply the pre-decoded signal RA12B11B having a logic "high" level and an output signal of the NAND gate NA8 and generate a second one of the third block selection signals BK2 for selecting the memory cell array block BLK2.

The NAND gate NA14 and the inverter I5 logically multiply the pre-decoded signal RA12B11B having a logic "high" level and an output signal of the NAND gate NA11 and generate a third one of the third block selection signals BK3 for selecting the memory cell array block BLK3.

In the same way as discussed above for BK1–BK3, the fourth through twelfth ones of the third block selection signals BK4–BK12 are generated for selecting the memory cell array blocks BLK4–BLK12.

Even though not shown in FIG. 5, word line selection signals for selecting the word lines WL1–WL704 are generated by decoding the third block selection signals BK1–BK12 and 10-bits of row address RA0–RA9.

While the invention has been particularly shown and described with reference to preferred embodiments thereof, it will be understood by those skilled in the art that the foregoing and other changes in form and details may be made therein without departing from the spirit and scope of the invention.

The memory cell arrays of a semiconductor memory device having word lines of ($2^k$+a) (k and a are integers) in accordance with embodiments of the invention require a smaller area on a semiconductor substrate than the memory cell arrays of a conventional semiconductor memory device having $2^k$ word lines.

What is claimed is:

1. A semiconductor memory device comprising:
   a memory cell array having (m×$2^n$) memory cell array blocks, wherein the memory cell array is composed of $2^n$ groups of memory cell array blocks with m memory cell array blocks per group, each of the memory cell array blocks having ($2^K$+a) word lines;
   a block selection signal generating circuit for generating a block selection signal for selecting one of the memory cell array blocks by decoding a plurality of row address signals.

2. The semiconductor memory device according to claim 1, wherein the block selection signal generating circuit comprises:
   a first block selection signal generating circuit for generating a first block selection signal for selecting one group from out of the $2^n$ groups;
   a second block selection signal generating circuit for generating a second block selection signal for selecting one memory cell array block from each of the $2^n$ groups;
   a third block selection signal generating circuit for generating a third block selection signal for selecting a memory cell array block out of the (m×$2^n$) memory cell array blocks in response to the first block selection signal and the second block selection signal.

3. A semiconductor memory device comprising:
   a memory cell array having (m×$2^n$) memory cell array blocks, wherein the memory cell array is composed of $2^n$ groups of memory cell array blocks with m memory cell array blocks per group, each of the memory cell array blocks having ($2^K$+a) word lines;
   a first block selection signal generating means for generating $2^n$ first block selection signals for selecting one of the $2^n$ groups by decoding a n-bit row address;
   a second block selection signal generating means for generating m second block selection signals by decoding an l-bit row address for selecting one of the m memory cell array blocks, particularly selecting one memory cell array block from every group at the same time;
   a third block selection signal generating means for generating (m×$2^n$) third block selection signals for selecting one of (m×$2^n$) memory cell array blocks by receiving the 2n first block selection signals and the m second block selection signals.

4. The semiconductor memory device according to claim 3, wherein m is 3.

5. The semiconductor memory device according to claim 4, wherein k is 9.

6. The semiconductor memory device according to claim 5, wherein a is 192.

7. The semiconductor memory device according to claim 6, wherein l is 5.

8. The semiconductor memory device according to claim 7, wherein the second block selection signal generating means comprises:
   a first pre-decoder for generating a first through fourth pre-decoded signal by pre-decoding a first and second bit from the row address;
   a second pre-decoder for generating a fifth through eighth pre-decoded signal by pre-decoding a third and fourth bit from the row address;
   a first one of the second block selection signal generating means for generating a first one of the second block selection signals that combines a signal that is produced by combining an inverted first pre-decoded signal, a second pre-decoded signal, and a seventh pre-decoded signal, a signal that is produced by combining the second pre-decoded signal, a fifth pre-decoded signal, and an inverted fifth bit from the row address;
   a second one of the second block selection signal generating means for generating a second one of the second block selection signals that combines a signal that is produced by combining the second and the sixth pre-decoded signals and a fifth bit from the row address, a signal which is produced by combining the second pre-decoded signal and the third bit from the row address, a signal that is produced by combining the third pre-decoded signal and an inverted third bit from the row address, and a signal that is produced by combining the third and the seventh pre-decoded signals and an inverted fifth bit from the row address;

a third one of the second block selection signal generating means for generating a third one of the second block selection signals that combines a signal that is produced by combining the third and the seventh pre-decoded signals and the last bit of the row address, a signal that is produced by combining the third and the eighth pre-decoded signals, and a signal that is produced by inverting a fourth pre-decoded signal.

9. The semiconductor memory device according to claim 8, wherein n equals 2.

10. The semiconductor memory device according to claim 9, wherein the third block selection signal generating means comprises:

a third pre-decoder for generating an eleventh to fourteenth pre-decoded signal by pre-decoding the first and second bit from the row address;

a third block selection signal generating circuit for generating a first through twelfth third block selection signal by combining the eleventh to fourteenth pre-decoded signals and the first through third of the second block selection signals.

11. A method of generating a block selection signal for a semiconductor memory device having a memory cell array including $2^n$ groups of memory cell array blocks, with m memory cell array blocks per group, each of the memory cell array blocks having ($2^k$+a) word lines, comprising:

generating a block selection signal for selecting a memory cell array block out of (m×$2^n$) memory cell array blocks by decoding a row address.

12. The method according to claim 11, wherein generating a block selection signal comprises:

generating first block selection signals for selecting one group from the $2^n$ groups;

generating second block selection signals for selecting one memory cell array block from every group of the $2^n$ groups;

generating third block selection signals for selecting one memory cell array block from the (m×$2^n$) memory cell array blocks by receiving the first block selection signals and the second block selection signals.

13. A method of generating a block selection signal for a semiconductor memory device having $2^n$ groups comprised of m memory cell array blocks, each memory cell array block having ($2^k$+a) word lines, comprising:

generating $2^n$ first block selection signals for selecting one of the $2^n$ groups by decoding a n-bit row address;

generating m second block selection signals by decoding l-bits for selecting one of the m memory cell array blocks in every group;

generating (m×$2^n$) third block selection signals for selecting one of (m×$2^n$) memory cell array blocks by receiving the $2^n$ first block selection signals and the m second block selection signals.

14. The method according to claim 13, wherein m is 3.

15. The method according to claim 14, wherein k is 9.

16. The method according to claim 15, wherein a is 192.

17. The method according to claim 16, wherein l is 5.

18. The method according to claim 17, wherein generating m second block selection signals comprises:

generating a first, second, third, and fourth pre-decoded signal by pre-decoding a first and second bit of a five-bit row address;

generating a fifth, sixth, seventh, and eighth pre-decoded signal by pre-decoding a third and fourth bit of the five-bit row address;

generating a first one of the m second block selection signals by combining a first signal produced by combining an inverted first pre-decoded signal, the second pre-decoded signal, and the seventh pre-decoded signal, with a second signal produced by combining the second pre-decoded signal, the fifth pre-decoded signal, and an inverted fifth bit of the five-bit row address;

generating a second one of the m second block selection signals by combining a third signal produced by combining the second and the sixth pre-decoded signals and a fifth bit of the five-bit row address, a fourth signal produced by combining the second pre-decoded signal and the third bit of the five-bit row address, a fifth signal produced by combining the third pre-decoded signal and an inverted third bit of the five-bit row address, and a sixth signal produced by combining the third and the seventh pre-decoded signals and the inverted fifth bit of the five-bit row address;

generating a third one of the m second block selection signals by combining a seventh signal produced by combining the third and the seventh pre-decoded signals and the fifth bit of the five-bit row address, an eighth signal produced by combining the third and the eighth pre-decoded signals, and a ninth signal produced by inverting the fourth pre-decoded signal.

19. The method according to claim 18, wherein n is 2.

20. The method according to claim 19, wherein generating (m×$2^n$) third block selection signals comprises:

generating an eleventh, twelfth, thirteenth, and fourteenth pre-decoded signal by pre-decoding the first and second bits of the five-bit row address;

generating a first, second, third, fourth, fifth, sixth, seventh, eighth, ninth, tenth, eleventh, and twelfth third block selection signal by combining the eleventh, twelfth, thirteenth, and fourteenth pre-decoded signals and the first, second, and third one of the m second block selection signals.

* * * * *

UNITED STATES PATENT AND TRADEMARK OFFICE
CERTIFICATE OF CORRECTION

PATENT NO. : 6,735,147 B2
DATED : May 11, 2004
INVENTOR(S) : Choi et al.

It is certified that error appears in the above-identified patent and that said Letters Patent is hereby corrected as shown below:

Title page,
Item [57], ABSTRACT,
Line 13, "decoding a 1-bit row" should read -- decoding a $\ell$-bit row --.

Column 3,
Line 48, "selecting in every group," should read -- selecting each memory cell array block in every group, --.
Line 49, "for each memory cell array block each memory cell array block out of the" should read -- for selecting one memory cell array block out of the --.

Column 8,
Line 28, "an 1-bit row address" should read -- an $\ell$-bit row address --.
Line 45, "wherein 1 is 5." should read -- wherein $\ell$ is 5. --.

Column 9
Line 57, "decoding 1-bits for" should read -- decoding $\ell$-bits for --.

Column 10,
Line 8, "wherein 1 is 5." should read -- wherein $\ell$ is 5. --.

Signed and Sealed this

Thirty-first Day of May, 2005

JON W. DUDAS
*Director of the United States Patent and Trademark Office*